(12) United States Patent
Ausserlechner

(10) Patent No.: US 11,831,208 B2
(45) Date of Patent: Nov. 28, 2023

(54) DEVICE COMPRISING A CHIP PACKAGE AND AN OVERLAP-FREE COIL LAYOUT

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 293 days.

(21) Appl. No.: 17/232,523

(22) Filed: Apr. 16, 2021

(65) Prior Publication Data

US 2021/0328483 A1 Oct. 21, 2021

(30) Foreign Application Priority Data

Apr. 20, 2020 (DE) .......................... 102020204951.3

(51) Int. Cl.
*G01B 7/14* (2006.01)
*G01B 7/30* (2006.01)
(Continued)

(52) U.S. Cl.
CPC ......... *H02K 11/225* (2016.01); *G01D 5/2046* (2013.01); *G01D 5/2053* (2013.01); *G01D 5/2066* (2013.01); *G01D 5/2073* (2013.01); *H02K 3/26* (2013.01); *H05K 1/0216* (2013.01); *H05K 1/165* (2013.01); *H05K 1/181* (2013.01); *G01B 7/003* (2013.01); *G01B 7/004* (2013.01); *H02K 2203/03* (2013.01);
(Continued)

(58) Field of Classification Search
CPC .... H02K 11/225; H02K 3/26; H02K 2203/03; G01D 5/2066; G01D 5/2053; G01D 5/2046; G01D 5/2073; H05K 1/0216; H05K 1/165; H05K 1/181; H05K 2201/09281; H05K 2201/10151; H05K 2201/10492; H05K 2201/10727; H05K 2201/10734; H01L 23/64; G01B 7/003; G01B 7/004; G01B 7/30
USPC ..... 324/51, 55, 200, 207.11, 207.13, 207.15, 324/207.16, 207.17
See application file for complete search history.

(56) References Cited

U.S. PATENT DOCUMENTS 6,236,199 B1 5/2001 Irle et al.
6,255,810 B1 7/2001 Irle et al.
(Continued)

FOREIGN PATENT DOCUMENTS

DE 19738836 A1 3/1999
DE 19738841 A1 3/1999

*Primary Examiner* — Raul J Rios Russo
(74) *Attorney, Agent, or Firm* — Harrity & Harrity, LLP

(57) ABSTRACT

A device includes a substrate with an excitation coil configured to generate a magnetic field in reaction to an input signal fed in, and with a pickup coil arrangement configured to generate an output signal in reaction to a magnetic field. The excitation coil includes one or more turns arranged around the pickup coil arrangement in a ring-shaped manner in a plan view of the substrate plane. The device further includes a chip package comprising at least one electrical connection connected to the pickup coil arrangement by means of a signal-carrying conductor. In accordance with the concept described herein, the chip package is positioned on the substrate in such a way that the signal-carrying conductor and the one or more turns of the excitation coil do not overlap in a plan view of the substrate plane.

16 Claims, 9 Drawing Sheets

(51) Int. Cl.
  *H01F 5/00*    (2006.01)
  *H02K 11/225*  (2016.01)
  *H05K 1/16*    (2006.01)
  *H05K 1/18*    (2006.01)
  *H05K 1/02*    (2006.01)
  *H02K 3/26*    (2006.01)
  *G01D 5/20*    (2006.01)
  *G01B 7/00*    (2006.01)
  *G01B 7/004*   (2006.01)

(52) U.S. Cl.
  CPC .............. *H05K 2201/09281* (2013.01); *H05K 2201/10151* (2013.01); *H05K 2201/10492* (2013.01); *H05K 2201/10727* (2013.01); *H05K 2201/10734* (2013.01)

(56) References Cited

U.S. PATENT DOCUMENTS

| | | | | |
|---|---|---|---|---|
| 2001/0026154 | A1* | 10/2001 | Nekado | G01D 3/036 324/207.17 |
| 2006/0132120 | A1* | 6/2006 | Luber | G01D 5/202 324/207.16 |
| 2019/0331541 | A1 | 10/2019 | Janisch et al. | |
| 2019/0360840 | A1* | 11/2019 | Mack | H05K 1/165 |
| 2021/0100098 | A1* | 4/2021 | Qama | G01D 5/204 |
| 2021/0190611 | A1* | 6/2021 | Liang | G01L 3/105 |

* cited by examiner

DEVICE COMPRISING A CHIP PACKAGE AND AN OVERLAP-FREE COIL LAYOUT

RELATED APPLICATION

This application claims priority to German Patent Application No. 102020204951.3, filed on Apr. 20, 2020, which is incorporated herein by reference in its entirety.

FIELD

The present disclosure relates to a device, for example a stator component for an inductive angle sensor, wherein the device includes a substrate with at least one coil for coupling out a magnetic field and also with at least one coil for coupling in a magnetic field. The device further includes an electronic chip for operating said coils. The electronic chip is arranged in a chip package comprising electrical connections for connecting the coils and the electronic chip. In this case, the chip package is advantageously arranged on the substrate in such a way that conductor tracks of the two coils do not overlap.

BACKGROUND

Inductive angle sensors generally comprise a stator component and also a rotor component that is rotatable relative thereto. The stator component can be implemented for example as a printed circuit board (PBC). An excitation coil can be arranged on the PCB. The excitation coil is fed with an input signal, for example with an alternating current signal. In reaction thereto, the excitation coil generates a magnetic field that couples out from the excitation coil. The rotor component situated opposite has an inductive target, into which the magnetic field couples. In reaction thereto, the inductive target generates eddy currents that in turn generate a secondary magnetic field, which couples out from the inductive target. The secondary magnetic field then couples into a pickup coil arrangement arranged on the stator component. In reaction thereto, the pickup coil arrangement generates an output signal representing the angle between the stator component and the rotor component.

If a printed circuit board (PCB) is viewed from above, it is then evident that the pickup coil arrangement is arranged within the excitation coil, that is to say that the turns of the excitation coil surround the pickup coil arrangement in a ring-shaped manner. A chip package including a chip with a corresponding electronic circuit for operating the angle sensor is additionally arranged on the PCB. The chip package is arranged outside the ring-shaped excitation coil, in a plan view of the PCB. In order then to be able to connect the pickup coil arrangement to the chip, the connecting lines of the pickup coil arrangement have to be led out from the ring-shaped excitation coil in some way. This inevitably results in the connecting lines of the pickup coil arrangement overlapping or crossing the turns of the excitation coil. The connecting lines of the pickup coil arrangement and the turns of the excitation coil are led in different planes in or on the substrate. Therefore, the overlapping here should not be understood as physical "coming into contact" (short circuit) of the connecting lines of the pickup coil arrangement with the turns of the excitation coil, but rather as contactless or non-contact overlapping of conductor track traces running over or under one another. However, this leads to undesired interference between the excitation coil and the pickup coil arrangement, or to the coupling of interference signals into the connecting lines of the pickup coil arrangement.

It would therefore be desirable to provide a device for an inductive angle sensor which does not have the disadvantages mentioned above, and to the greatest possible extent avoids or at least greatly suppresses in particular interference between the excitation coil and the pickup coil arrangement.

SUMMARY

A device having the features of the accompanying claims is proposed. Embodiments and further advantageous aspects of this device are mentioned in the respective dependent patent claims.

The device described herein includes, inter alia, a substrate with an excitation coil and a pickup coil arrangement. The excitation coil is configured to generate a magnetic field in reaction to an input signal fed in. The pickup coil arrangement is configured to generate an output signal in reaction to a magnetic field. The pickup coil arrangement includes at least one pickup coil configured in one or more metallization layers of the substrate. The excitation coil in turn includes one or more turns arranged around the pickup coil arrangement in a ring-shaped manner in a plan view of the substrate plane. The device furthermore includes an electronic chip with a circuit. The circuit is configured to feed the excitation coil with the input signal and/or to detect the output signal of the pickup coil arrangement. The electronic chip is arranged in a chip package (or chip housing) including at least one electrical connection connected to the at least one pickup coil of the pickup coil arrangement by means of a signal-carrying conductor. In accordance with the innovative concept described herein, the chip package is advantageously positioned on the substrate in such a way that the signal-carrying conductor and the one or more turns of the excitation coil do not overlap in a plan view of the substrate plane.

BRIEF DESCRIPTION OF THE DRAWINGS

Some exemplary embodiments are illustrated by way of example in the drawing and are explained below. In the figures.

DETAILED DESCRIPTION

Exemplary embodiments are described in greater detail below with reference to the figures, wherein elements having the same or a similar function are provided with the same reference signs.

Insofar as k-fold symmetry is mentioned herein, this is understood to mean a form of circular or rotational symmetry. A body has k-fold symmetry if it can be rotated about an axis by 360°*n/k, such that it appears the same again after the rotation as before the rotation (wherein n is an arbitrary whole number (integer)).

Figure 7:
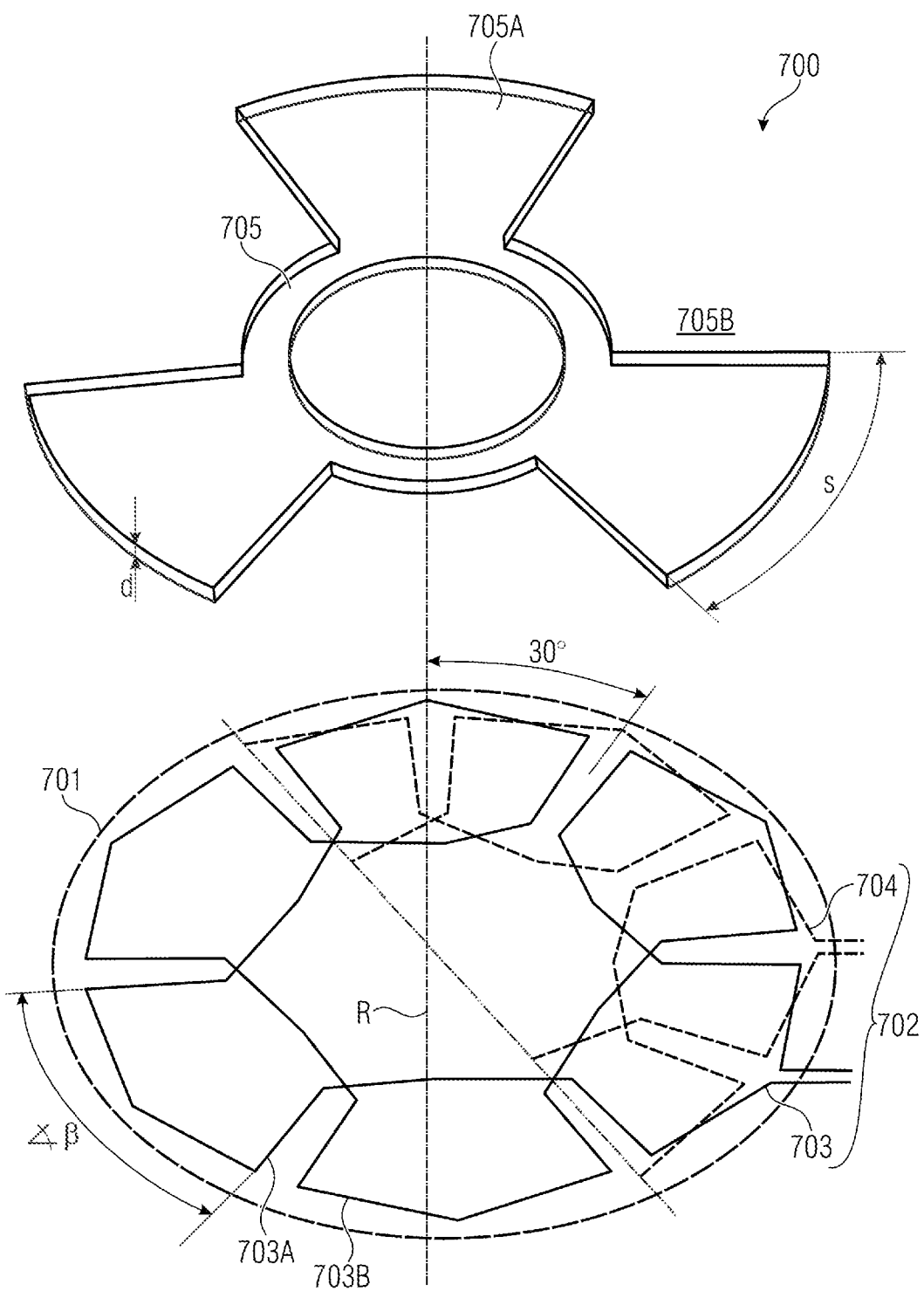
FIG. 7 shows a schematic perspective view of a conventional inductive angle sensor.

Firstly, a conventional inductive angle sensor in accordance with the prior art will be discussed as an introduction to the underlying problem here. FIG. 7 shows a schematic view of such an inductive angle sensor 700.

The angle sensor 700 comprises an excitation coil 701 and a pickup coil arrangement 702 having two individual pickup coils 703, 704 offset with respect to one another. The excitation coil 701 and the pickup coil arrangement 702 are normally arranged on a stator component (not explicitly illustrated here). The angle sensor 700 furthermore comprises an inductive target 705. The target 705 is normally arranged on a rotor component (not explicitly illustrated here).

The target 705 can be for example a stamped-out metal shaped part having a thickness d. The target 705 can have k-fold symmetry. In this example, the target 705 has 3-fold symmetry within each case three teeth 705A and three gaps 705B. The teeth 705A have a span s at the outer radius.

The pickup coils 703, 704 can have the same k-fold symmetry as the target 705. In this example, the two pickup coils 703, 704 have 3-fold symmetry, wherein respectively two turns 703A, 703B situated next to one another match one another. They are wound in different directions in order to compensate for homogeneous external magnetic fields (interference fields) and symmetrical interference fields of the excitation coil 701. They are therefore also referred to as astatic. The turns 703A, 703B can have a turn angle @. The first and second pickup coils 703, 704 are arranged offset by an angle (here: 30°) with respect to one another. This offset angle depends on the variable k of the k-fold symmetry of the pickup coils 703, 704.

The excitation coil 701 and the pickup coils 703, 704 are arranged rotationally symmetrically around a common rotation axis R. In this case, the excitation coil 701 is arranged around the pickup coils 703, 704 in a ring-shaped manner.

Figure 8A:
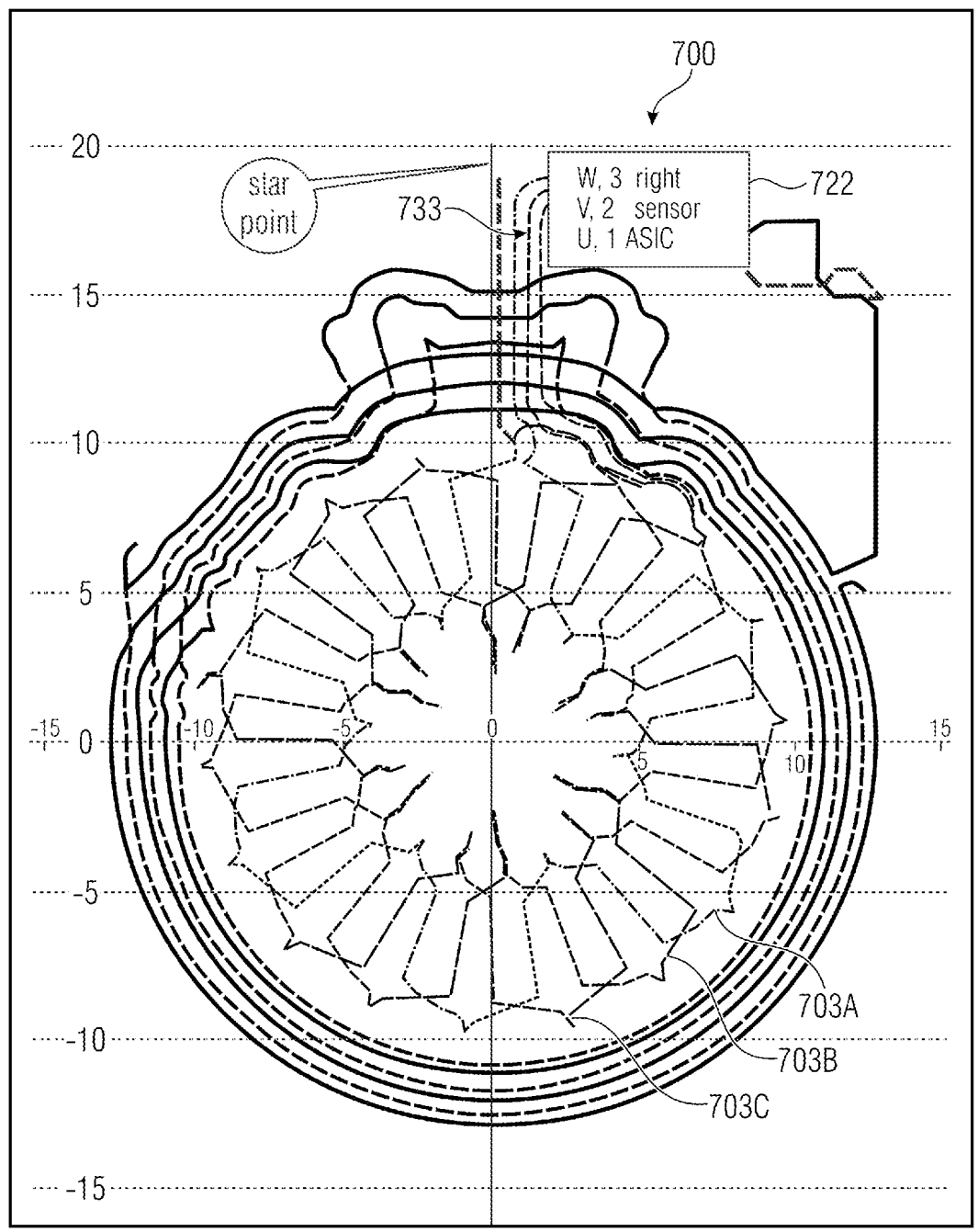
FIG. 8A shows a coil layout of a stator component of a conventional angle sensor.
Figure 8B:
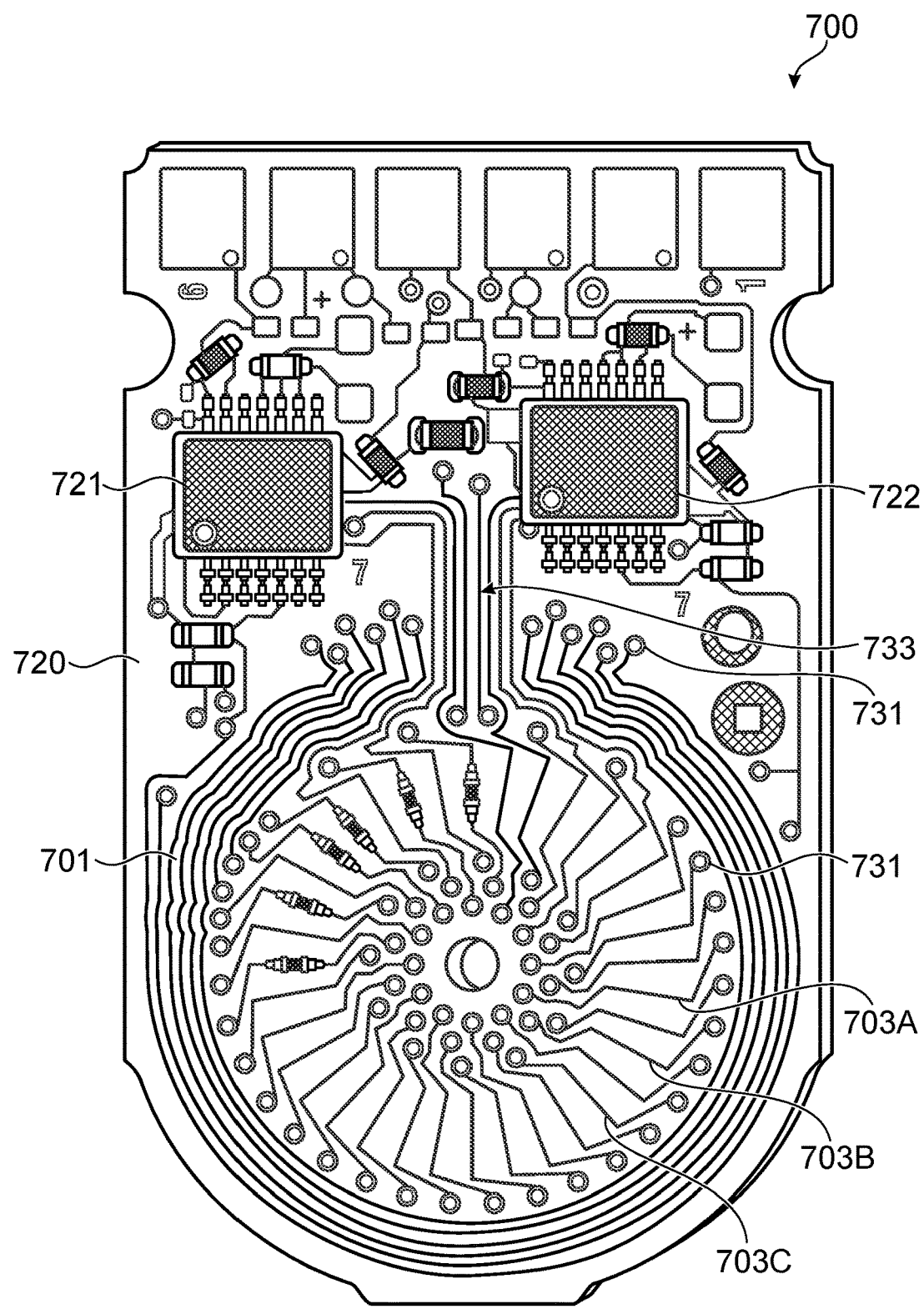
FIG. 8B shows a plan view of the stator component associated with the coil layout from FIG. 8A.

FIGS. 8A and 8B show the associated problem somewhat more clearly. FIG. 8A is a schematic coil layout of the device 700 shown in FIG. 8B. As can be seen in FIG. 8B, said device 700, which is a stator component of an inductive angle sensor, comprises a PCB 720, on which a plurality of coils 701, 703A, 703B, 703C and also two chip packages 721, 722 are arranged. In this regard, a first, a second and a third pickup coil 703A, 703B, 703C and also an excitation coil 701 surrounding the pickup coils in a ring-shaped manner are arranged on the PCB 720. The pickup coils 703A, 703B, 703C are offset rotationally by in each case 10° with respect to one another.

The PCB 720 comprises two metallization layers (not visible here), in which the coils 701, 703A, 703B, 703C are configured. The blue lines illustrated in FIG. 8A identify conductor track traces in a lower metallization layer and the red lines identify conductor track traces in an upper metallization layer. In this case the coil turns of the individual coils 701, 703A, 703B, 703C are routed such that they alternate between the upper and lower metallization layers. In this regard, half a turn is routed in the upper metallization layer, and the next half turn is then routed in the lower metallization layer. The change between the two metallization layers is realized by means of vias 731. Only the conductor track traces embodied in the upper metallization layer are discernible in FIG. 8B, for which reason here as it were for all the coils only half of their turns can be seen.

The vias are not illustrated in FIG. 8A, for the sake of clarity. The excitation coil 701 is illustrated by a solid line, and the three pickup coils 703A, 703B, 703C are illustrated by dashed lines with short and long dashes and by a dotted line. Only the right-hand chip package 722 of the two chip packages is illustrated, likewise for the sake of better clarity. The excitation coil 701 and also the pickup coils 703A, 703B, 703C are connected to the chip package 722. Here, too, for the sake of clarity, only the conductor track traces 733 leading to the right-hand chip package 722 are illustrated.

As can be discerned in FIGS. 8A and 8B, the pickup coils 703A, 703B, 703C are arranged within the excitation coil 701, i.e. the excitation coil 701 surrounds the pickup coils 703A, 703B, 703C in a ring-shaped manner. The chip packages 721, 722 are arranged outside the ring-shaped excitation coil 701. In order then to contact the inner pickup coils 703A, 703B, 703C with the outer chip packages 721, 722, the conductor track traces 733 of the pickup coils 703A, 703B, 703C have to be led out from the ring-shaped excitation coil 701. This has the effect that the conductor track traces 733 of the pickup coils 703A, 703B, 703C have to cross the turns of the ring-shaped excitation coil 701.

Here, too, it should again be pointed out that the overlapping should not be understood as physical "coming into contact" (short circuit) of the connecting lines of the pickup coil arrangement with the turns of the excitation coil, but rather as contactless or non-contact overlapping of conductor track traces running over or under one another.

However, since the PCB comprises two metallization layers, in which the respective coils 701, 703A, 703B, 703C are configured, it is problematic to realize overlapping of the conductor track traces 733 of the pickup coils 703A, 703B, 703C with the turns of the excitation coil 701. In this regard, at the overlap location, all turns of the excitation coil 701 have to be routed in the lower (or upper) metallization layer, while all conductor track traces 733 of the pickup coils 703A, 703B, 703C are routed in the upper (or respectively lower) metallization layer.

This results in asymmetries, however. As can be seen in FIG. 8A, in particular, the turns of the excitation coil 701 have a crownlike shape at the overlap location, and the conductor track traces 733 of the pickup coils 703A, 703B, 703C that are routed thereunder (or thereover) open up a region in which interference with the turns of the excitation coil 701 appears, since the magnetic flux of the excitation coil 701 also couples into the conductor track traces 733 of the pickup coils 703A, 703B, 703C in an undesired manner.

An additional factor, moreover, is that even the turns of the excitation coil 701 of the left-hand chip package 721 magnetically or inductively couple into the conductor track traces 733 of the right-hand package 722. This in turn results in an undesired coupling between the two angle sensor systems (left-hand chip package and respectively right-hand chip package). Furthermore, the asymmetry of the conductor track traces 733 and also of the crownlike protuberance of the otherwise round excitation coil 701 results in a mismatch during the desired common coupling between the excitation coil 701 and the pickup coils 703A, 703B, 703C.

This problem is solved by means of a device 100 in accordance with the innovative concept described herein.

Figure 1:
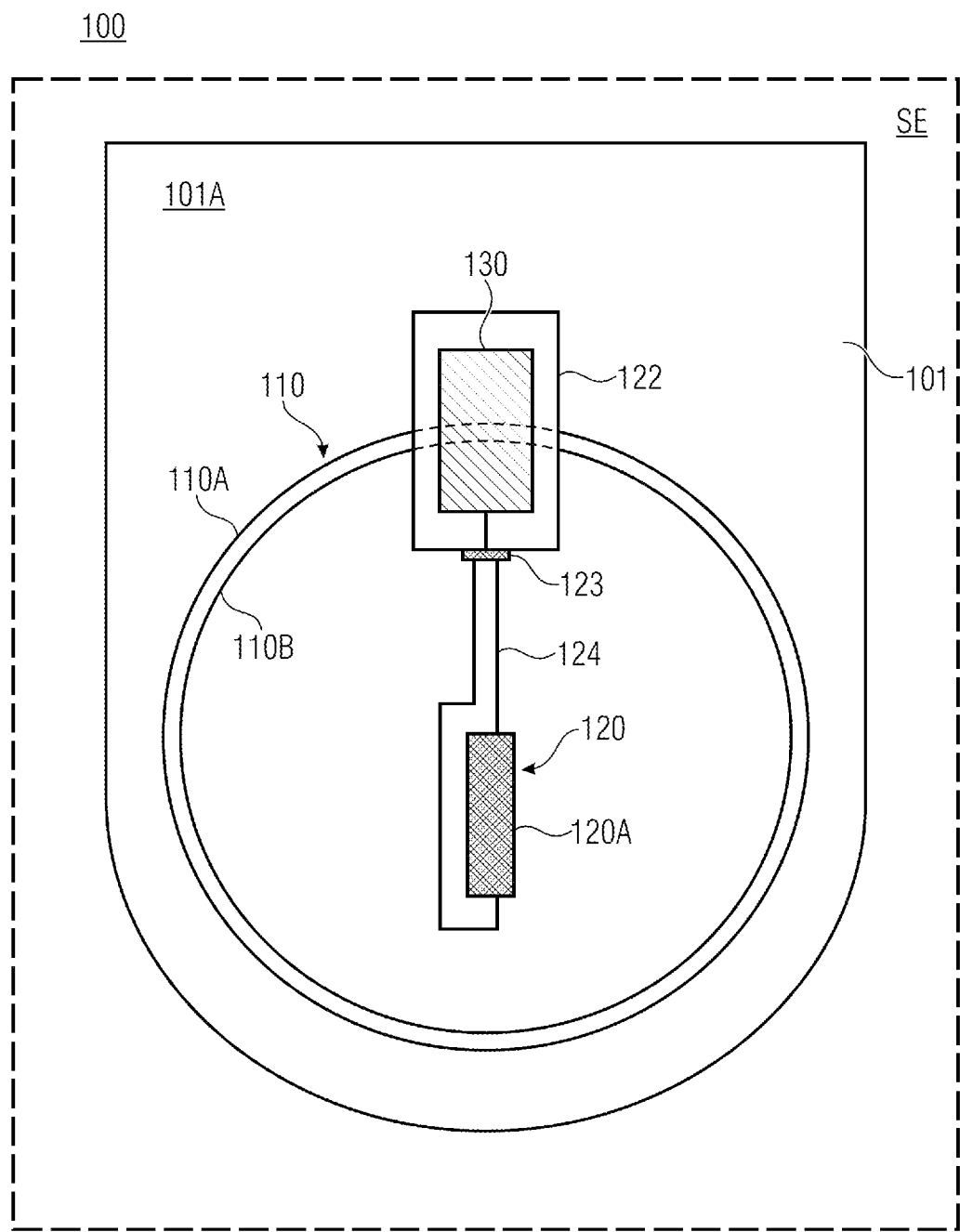
FIG. 1 shows a schematic plan view of a device in accordance with one exemplary embodiment.

FIG. 1 shows a non-limiting exemplary embodiment of such a device 100. The device 100 can be, in particular, a stator component of an inductive angle sensor. The device 100 comprises a substrate 101. The substrate 101 can be embodied as a PCB, for example. The substrate 101 is substantially flat and thus extends in a corresponding substrate plane SE. That is to say that the substrate plane SE substantially corresponds to the main direction of extent of the substrate 101. The substrate plane SE runs substantially parallel to the flat surfaces of the flat substrate 101. Accordingly, the substrate 101 has a first surface or main side 101A, which runs parallel to the substrate plane SE, and also an opposite second surface or main side 101B (not visible here), which likewise runs parallel to the substrate plane SE. FIG. 1 shows a plan view of the substrate plane SE, and thus at the same time also a plan view of the just mentioned first surface or main side 101A of the substantially flat substrate 101. The second main side 101B would be arranged correspondingly on the rear side, not visible here.

The substrate 101 can comprise at least one metallization layer. Preferably, the substrate 101 can comprise two or else a plurality of metallization layers, wherein the metallization layers can extend parallel to the substrate plane SE, or parallel to the first and/or second main side 101A, 101B of the substrate 101. In this case, however, the metallization layers are spaced apart from one another in a direction perpendicular to the substrate plane SE, that is to say are stacked one above another for example in and/or on the substrate 101. By way of example, a first metallization layer can be provided on the first main side 101A of the substrate 101, and a second metallization layer can be provided on the opposite second main side 101B of the substrate 101.

The substrate 101 has an excitation coil 110. The excitation coil 110 can comprise one or more turns. In the non-limiting, exemplary embodiment depicted here, the excitation coil 110 comprises a first turn 110A and a second turn 110B routed parallel thereto. The excitation coil 110 is configured to generate a magnetic field in reaction to an input signal fed in.

Said magnetic field can be received by an inductive target (not illustrated here). The inductive target in turn can be secured on a rotor component arranged rotatably relative to the substrate (stator component). It should be mentioned at this juncture that the device 100 described herein can also be a rotor component. In this case, the inductive target could then be arranged on a stator component.

The substrate 101 furthermore has a pickup coil arrangement 120. The pickup coil arrangement 120 is configured to generate an output signal in reaction to a magnetic field. Said magnetic field can be a secondary magnetic field which emanates from the inductive target and which couples into the pickup coil arrangement 120.

The pickup coil arrangement 120 comprises at least one pickup coil 120A. However, the pickup coil arrangement 120 can also comprise more than one pickup coil 120A. Moreover, the device 100 itself can comprise more than one pickup coil arrangement 120 comprising in turn in each case one or more individual pickup coils.

The individual pickup coils 120A of the pickup coil arrangement 120, and optionally also the individual turns 110A, 110B of the excitation coil 110, can be configured in one or more metallization layers of the substrate 101. As mentioned above, the metallization layers can extend parallel to the substrate plane SE. Accordingly, therefore, the pickup coil arrangement(s) 120, and optionally the excitation coil 110, can thus also extend in each case in a plane parallel to the substrate plane SE.

In particular, the pickup coil arrangement(s) 120 and/or the excitation coil 110 can be configured in each case simultaneously in a plurality of metallization layers. That is to say that, for example, a first section (e.g. a first half) of a turn of a pickup coil 120A and/or of the excitation coil 110 could be configured in a first metallization layer, and a second section (e.g. a second half) could be configured in a second metallization layer. By means of vias, the individual sections (e.g. first and second halves) of the turns can be led back and forth alternately between the individual metallization layers. In this respect, reference should also be made once again to the explanations concerning FIGS. 8A and 8B.

As is evident in FIG. 1, the one or more turns 110A, 110B of the excitation coil 110 can be arranged around the pickup coil arrangement 120 in a ring-shaped manner, in a plan view of the substrate plane SE. To put it another way, the pickup coil arrangement 120 can be arranged within the ring-shaped excitation coil 110, again here, too, as seen in a plan view of the substrate plane SE.

The device 100 furthermore comprises an electronic chip 130. The electronic chip 130 can be configured as a semiconductor chip. The electronic chip 130 can have a circuit, for example an integrated semiconductor circuit, for operating the device 100, and in particular for operating the excitation coil 110 and/or the pickup coil arrangement 120. For this purpose, the circuit can be configured for example to feed the excitation coil 110 with the abovementioned input signal (e.g. an alternating current signal) and/or to detect the output signal (e.g. an induced alternating current signal) of the pickup coil arrangement 120.

The electronic chip 130 is arranged in a chip package 122 comprising at least one electrical connection 123 connected to the at least one pickup coil 120A of the pickup coil arrangement 120 by means of a signal-carrying conductor 124.

The signal-carrying conductor 124 can be embodied or arranged in, at or on the substrate 101. The signal-carrying conductor 124 can be embodied for example in the form of a conductor track (trace) on a substrate 101, configured e.g. as a PCB. As can be seen in FIG. 1, the signal-carrying conductor 124 can be led as far as the electrical connection (terminal) 123 on the outer side of the chip package 122 and end at the electrical connection 123. The signal-carrying conductor 124 described herein should be understood to mean, in particular, the electrical conductor which is arranged in, at or on the substrate 101 and which is led outside the chip package 122, and which can be led as far as the chip package 122, or as far as the electrical connection (terminal) 123 of the chip package 122.

From the electrical connection 123, further electrical conductors (not explicitly illustrated here) can lead into the interior of the chip package 122. By way of example, the chip package 122 can comprise contact leads, by which it is mounted on the substrate 101, wherein said contact leads can in turn extend into the interior of the chip package 122. There a bond wire, for example, can then be connected to such a contact lead. Said bond wire can run over the electronic chip 130 and be contacted with a bond pad provided on the chip 130. Proceeding from the bond pad, one or more metallization tracks on the chip 130, e.g. in one or more metallization planes, can extend further to an electronic circuit, e.g. a transistor of a preamplifier input. In a plan view of the substrate plane SE, this transistor input can be arranged outside, or preferably within, the one or more turns 110A, 110B of the excitation coil 110. Accordingly, the signal-carrying conductor 124 described herein can thus also be understood to mean, under certain circumstances, the one or more electrical conductors which are led within the chip package 122 and are contacted with the conductor 124 led outside the chip package 122.

In accordance with the innovative concept described herein, the chip package 122 is positioned on the substrate 101 in such a way that the signal-carrying conductor 124 and the one or more turns 110A, 110B of the excitation coil 110 do not overlap in a plan view of the substrate plane SE.

As mentioned in the introduction, the one or more turns 110A, 110B of the excitation coil 110 and also the signal-carrying conductor 124 of the pickup coil arrangement 120 can be configured in different metallization layers and thus be routed in different planes in or on the substrate. It should therefore once again explicitly be pointed out at this juncture that the overlapping here should not be understood as physical "coming into contact" (short circuit) of the signal-carrying conductor 124 of the pickup coil arrangement 120 with the turns 110A, 110B of the excitation coil 110, but rather as contactless or non-contact overlapping of conductor track traces led over or under one another, i.e. of the signal-carrying conductor 124 and of the turns 110A, 110B of the excitation coil 110, and in particular of the signal-carrying conductor 124 led outside the chip package 122 in, at or on the substrate 101 or PCB.

In this case, the chip package 122 can be positioned in such a way that it is arranged over at least one portion of the turns 110A, 110B of the excitation coil 110. That is to say that this portion of the turns 110A, 110B of the excitation coil 110 runs through below the chip package 122, likewise in a plan view of the substrate plane SE. This is indicated by dashed lines below the chip package 122 in FIG. 1.

In accordance with such an exemplary embodiment, the chip package 122 can be arranged on the substrate 101 for example in such a way that it extends over at least one of the turns 110A, 110B of the excitation coil 110, in a plan view of the substrate plane SE, and said at least one turn thus runs through under the chip package 122.

The chip package 122 can be mounted on the substrate 101, for example as an SMD (Surface Mount Device). This allows an understanding of what is meant when it is stated that the chip package 122 is arranged "over" the respective conductor track traces (i.e. signal-carrying conductor 124 and also turns 110A, 110B of the excitation coil 110). Here, too, this should not be understood to mean that the chip package 122 must physically come into contact with the conductor track traces. Rather, it should be understood to mean that, in a plan view of the substrate plane SE, the contour of the chip package 122 covers the underlying conductor track traces (i.e. signal-carrying conductor 124 and also turns 110A, 110B of the excitation coil 110).

Apart from that, the chip package 122 can additionally be positioned on the substrate 101 in such a way that the abovementioned electrical connection 123 connected to the at least one pickup coil 120A of the pickup coil arrangement 120 is arranged within the ring-shaped excitation coil 110, in a plan view of the substrate plane SE. Alternatively, the chip package 122 can be positioned on the substrate 101 in such a way that the abovementioned electrical connection 123 connected to the at least one pickup coil 120A of the pickup coil arrangement 120 faces at least the ring-shaped excitation coil 110, and in particular the inner region of the ring-shaped excitation coil 110, in a plan view of the substrate plane SE (see also FIG. 4).

Figure 2:
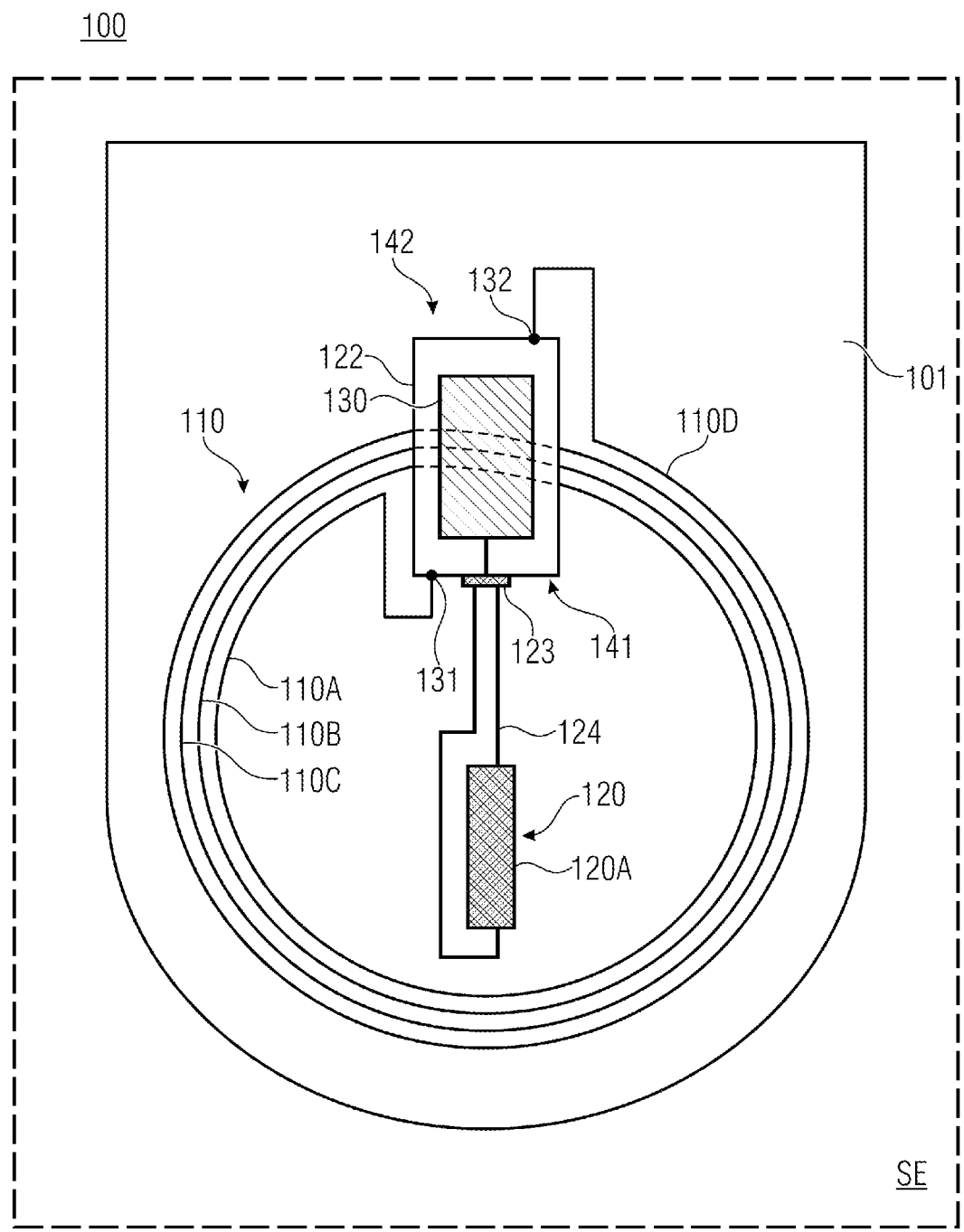
FIG. 2 shows a schematic plan view of a device in accordance with a further exemplary embodiment.

FIG. 2 shows a further exemplary embodiment of a device 100 in accordance with the innovative concept described herein. As has already been mentioned in the introduction, the excitation coil 110 can comprise an arbitrary plurality of turns. In this non-limiting example, the excitation coil 110 comprises four turns 110A, 110B, 110C, 110D. To put it somewhat more generally, the excitation coil 110 can comprise a number of 1 to it turns.

In accordance with one exemplary embodiment, the chip package 122 can be positioned on the substrate 101 in such a way that the chip package 122 is arranged over at least the second to (n−1)-th turns. That is to say that at least the second to (n−1)-th turns run through under the chip package 122. In the example depicted in FIG. 2 with a total of four turns 110A to 110D, therefore, at least the second and third turns 110B, 110C would thus run through under the chip package 122.

As can be seen here, the turns 110A to 110D can be arranged in spiral fashion. Depending on the manner of counting, for example, the transition from the first turn 110A to the second turn 110B, said transition running below the chip package 122, can already be counted as the second turn 110B, and the transition from the third or from the (n−1)-th turn 110C to the fourth or to the n-th turn 110D can be counted as the third or (n−1)-th turn 110C. In accordance with one conceivable exemplary embodiment, the chip package 122 can be arranged, with the exception of the first and n-th turns, over all the remaining turns of the excitation coil 110.

FIG. 2 additionally reveals that the chip package 122 comprises a first lateral outer side 141, at which the chip package 122 has contact connections 123, 131, and that the chip package 122 comprises an opposite second lateral outer side 142, at which the chip package 122 can likewise comprise contact connections 132. The chip package 122 can be positioned on the substrate 101 in such a way that at least one of the lateral outer sides 141, 142 of the chip package 122 that comprise contact connections is arranged within the excitation coil 110, in a plan view of the substrate plane SE.

Therefore, the chip package 122 can thus be arranged at least partly within the excitation coil 110, in a plan view of the substrate plane SE. However, the chip package 122 can also be positioned on the substrate 101 in such a way that the chip package 122 is arranged completely within the excitation coil 110, in a plan view of the substrate plane SE.

In the non-limiting exemplary embodiment depicted here, the chip package 122 comprises on its first lateral outer side 141 a first excitation coil connection 131, to which a turn, and preferably the first turn 110A, of the excitation coil 110 can be connected. Furthermore, the chip package 122 comprises here on its opposite second lateral outer side 142 a second excitation coil connection 132, to which a further turn, and preferably the last turn 110D, of the excitation coil 110 can be connected. In this case, the first excitation coil connection 131 can be arranged within the excitation coil 110, in a plan view of the substrate plane SE, and the second excitation coil connection 132 can be arranged outside the excitation coil 110, in a plan view of the substrate plane SE.

Figure 3:
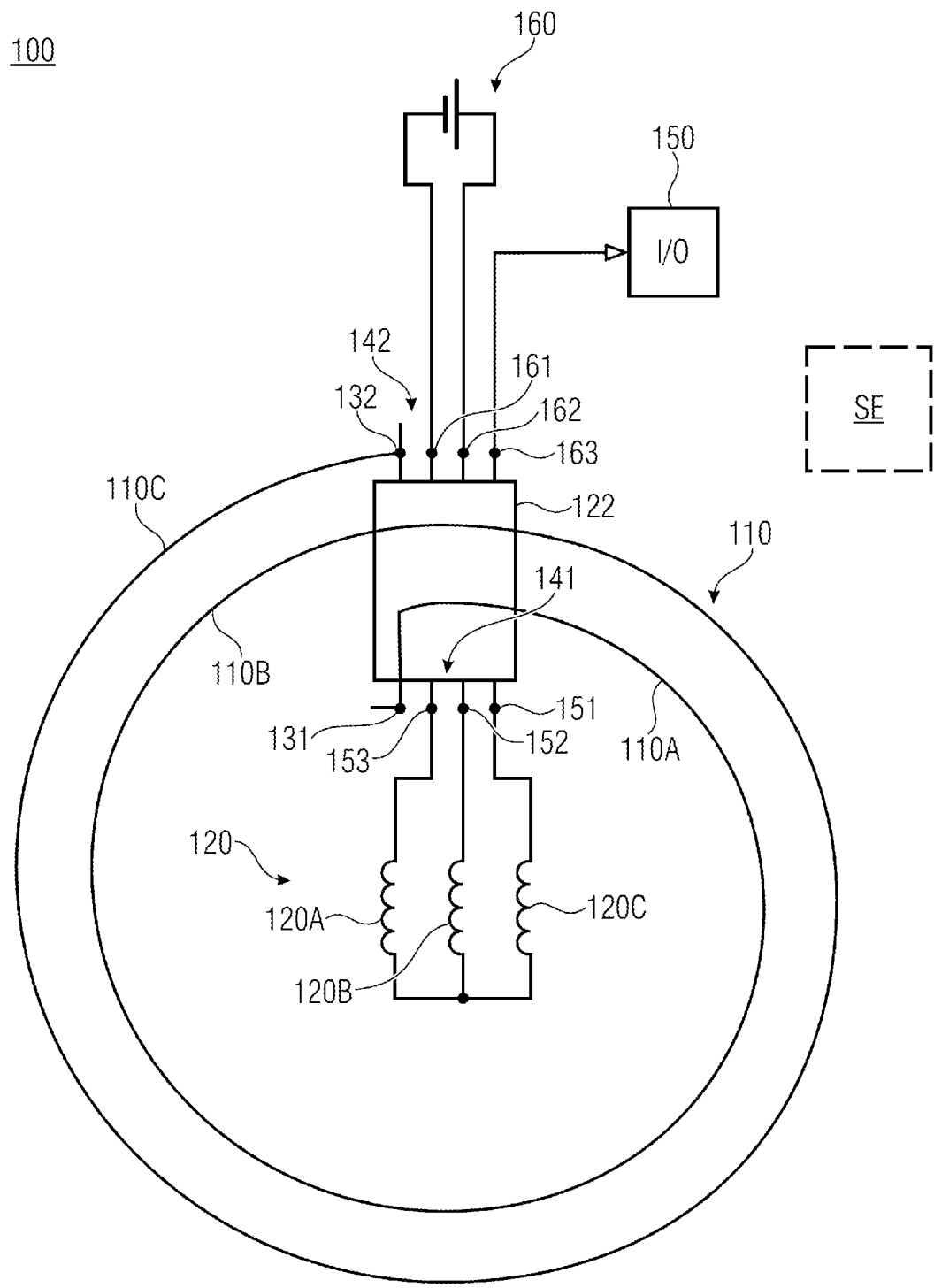
FIG. 3 shows a schematic plan view of a device in accordance with a further exemplary embodiment.

FIG. 3 shows a further exemplary embodiment of a device 100. Here, too, the chip package 122 comprises a first lateral outer side 141 comprising contact connections, and also an opposite second lateral outer side 142 comprising contact connections. Here the first turn 110A of the excitation coil 110 is also guided along below the chip package 122. This can hold true moreover for all embodiments described herein.

The device 100 here additionally comprises a pickup coil arrangement 120 having a total of three individual pickup coils 120A, 120B, 120C. All three pickup coils 120A, 120B, 120C are illustrated merely symbolically as inductances. Their physical conductor tracks can lie within the first turn 110A of the excitation coil 110, in a plan view of the substrate plane SE. The chip package 122 comprises a corresponding number of electrical contact connections 151, 152, 153 for connecting the individual pickup coils 120A, 120B, 120C. Said electrical contact connections 151, 152, 153 can be arranged within the excitation coil 110, in a plan view of the substrate plane SE.

The chip package 122 can furthermore comprise at least one power supply connection for connecting a power supply source 160. This can involve a bipolar power supply connection 161, 162 in the exemplary embodiment shown here. Alternatively, or additionally, the chip package 122 can comprise at least one I/O port 163, for example a (combined) signal input and/or signal output connection 163. The I/O port 163 can be connected to a control unit 150 configured to supply an input signal for the excitation coil 110 and/or to receive and optionally to evaluate an output signal extracted from the pickup coil arrangement 120.

At least one of these connections, that is to say the power supply connection 161, 162 and/or the I/O port or signal input and/or signal output connection 163 can be arranged on the second lateral outer side 142 of the chip package 122 arranged outside the ring-shaped excitation coil 110. In the exemplary embodiment shown here, both the power supply connection 161, 162 and the signal input and/or signal output connection 163 can be arranged on the second lateral outer side 142 of the chip package 122 arranged outside the ring-shaped excitation coil 110.

Figure 4:
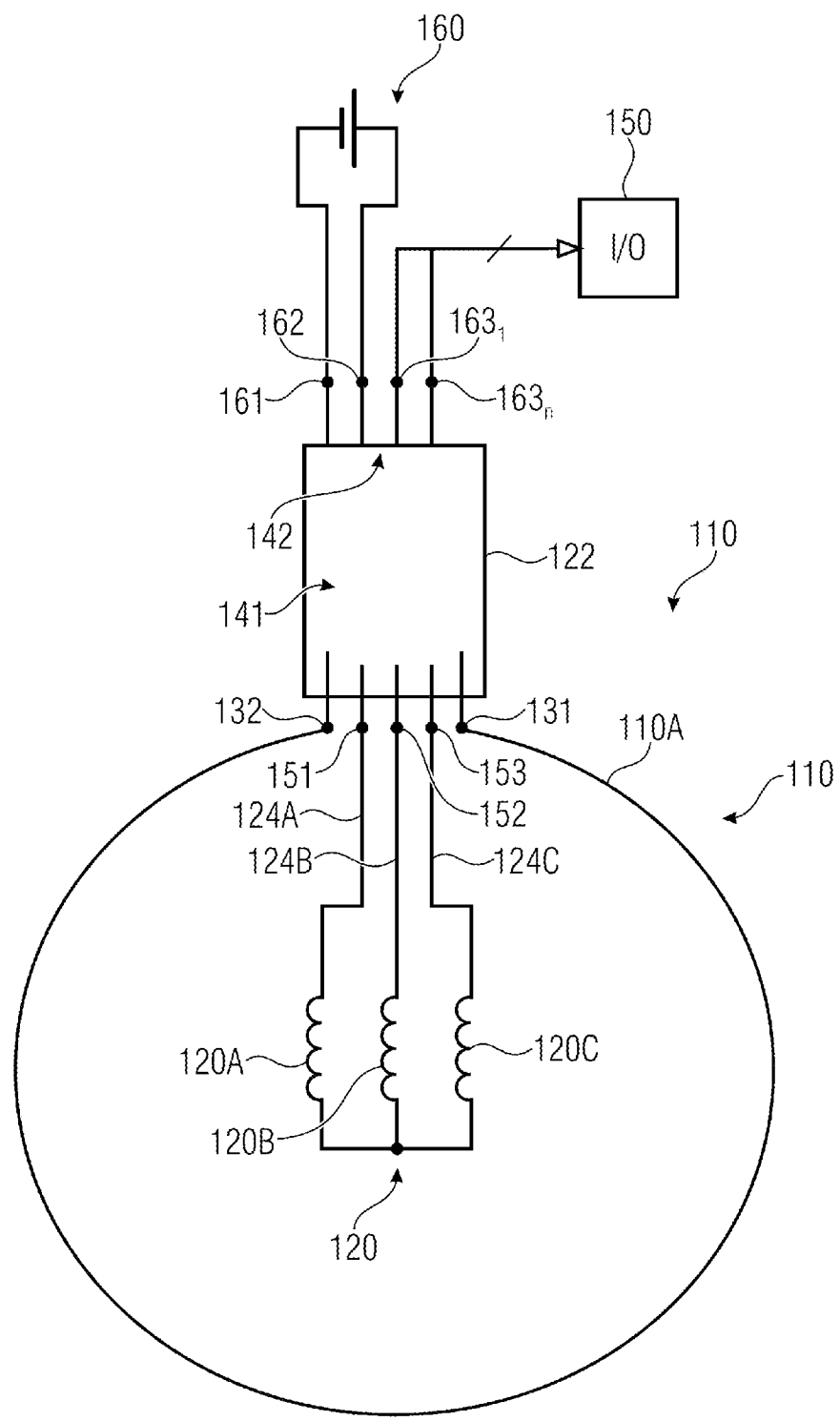
FIG. 4 shows a schematic plan view of a device in accordance with a further exemplary embodiment.

FIG. 4 shows a further exemplary embodiment of a device 100. One difference with respect to the embodiment discussed above is that here both the first excitation coil connection 131 and the second excitation coil connection 132 are arranged on the first lateral outer side 141 of the chip package 122 comprising contact connections. The above-mentioned electrical contact connections 151, 152, 153 for connecting the individual pickup coils 120A, 120B, 120C can also be arranged on the first lateral outer side 141 of the chip package 122. The first lateral outer side 141 here faces the excitation coil 110, and in this case in particular the inner region of the excitation coil 110 as seen in plan view. The signal-carrying conductors 124A, 124B, 124C of the respective individual pickup coils 120A, 120B, 120C of the pickup coil arrangement 120 are led into the inner region of the excitation coil 110.

In this case, the chip package 122 is positioned on the substrate 101 in such a way that the signal-carrying conductors 124A, 124B, 124C of the respective individual pickup coils 120A, 120B, 120C of the pickup coil arrangement 120 in this case do not overlap the one or more turns 110A of the excitation coil 110. For this purpose, for example, the electrical contact connections 151, 152, 153 for connecting the individual pickup coils 120A, 120B, 120C can be arranged at the lateral outer side 141 of the chip package 122 in such a way that they are positioned along said lateral outer side 141 between the contact connections 131, 132 of the excitation coil 110.

A further difference shown here, which can hold true however for all embodiments, is the number of I/O ports. Specifically, the chip package 122 can comprise a number of 1 to it I/O ports $163_1$ to $163_n$, of which at least one, and preferably all, are arranged on the second lateral outer side 142 of the chip package 122, wherein said second lateral outer side 142 faces away from the excitation coil 110 or is arranged outside the excitation coil 110.

In principle, and again this also holds true for all embodiments described herein, the power supply connections 161, 162 and/or the I/O ports $163_1$ to $163_n$ can be arranged on the second lateral outer side 142 of the chip package 122 comprising contact connections, wherein said second lateral outer side 142 faces away from the ring-shaped excitation coil 110. The electrical contact connections 151, 152, 153 for connecting the individual pickup coils 120A, 120B, 120C of the pickup coil arrangement 120 can be arranged on the opposite first lateral outer side 141 of the chip package 122 comprising contact connections, wherein said first lateral outer side 141 faces the—in a plan view of the substrate plane SE—inner region (e.g. the center) of the ring-shaped excitation coil 110.

As mentioned in the introduction, the device 100 can comprise a plurality of pickup coil arrangements each having a plurality of individual pickup coils. In some embodiments, all electrical contact connections for connecting the individual pickup coils of the plurality of pickup coil arrangements can be arranged on the first lateral outer side 141 of the chip package 122 comprising contact connections, wherein said first lateral outer side 141 faces the—in a plan view of the substrate plane SE—inner region (e.g. the center) of the ring-shaped excitation coil 110 and/or is arranged within the excitation coil 110.

Figure 5:
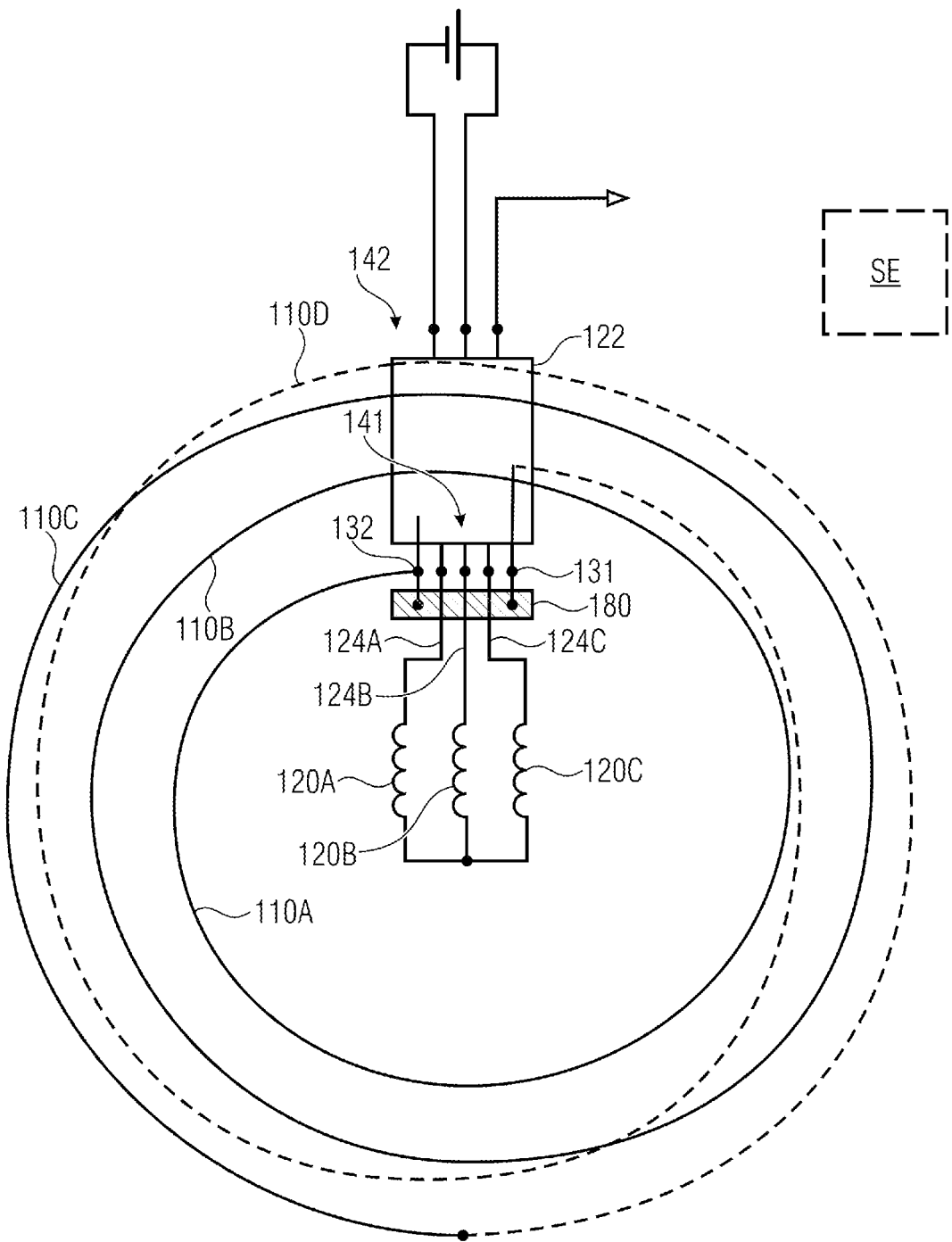
FIG. 5 shows a schematic plan view of a device in accordance with a further exemplary embodiment.

FIG. 5 shows a further exemplary embodiment of a device 100. This device 100 differs from the embodiments discussed above inter alia in that it comprises an electrical component 180, and in particular a capacitor element (tank capacitor), which is connected in parallel with the two excitation coil connections 131, 132. The component 180 here is arranged within the ring-shaped excitation coil 110, in a plan view of the substrate plane SE. The component 180 can be configured as an SMD device (SMD: Surface Mount Device) and can be arranged on the substrate 101. The signal-carrying conductors 124A, 124B, 124C of the pickup coils 120A, 120B, 120C can be led in one or more metallization layers below the component 180 through the latter.

An alternative exemplary embodiment, not explicitly illustrated here, provides for the two excitation coil connections 131, 132 to be arranged on the second lateral outer side 142 of the chip package 122 arranged outside the ring-shaped excitation coil 110. Accordingly, the electrical component 180 (e.g. capacitor) connected in parallel therewith could then also be arranged outside the excitation coil 110, in a plan view of the substrate plane SE.

If one of the two excitation coil connections 131, 132 were arranged on the first lateral outer side 141 of the chip package 122 and the other of the two excitation coil connections 131, 132 were arranged on the second lateral outer side 142 of the chip package 122 (see e.g. FIG. 3), then the component 180 connected in parallel therewith would also be arranged over at least one of the turns 110A 110D of the excitation coil 110, such that this at least one turn would then correspondingly run through under the component 180.

A further conceivable embodiment, although not explicitly illustrated here, could provide for the electrical component 180, and in particular a capacitor element, to be integrated into the chip package 122. That is to say that the electronic chip 130 and the component (e.g. capacitor) 180 would then be arranged in the chip package 122. In this case, the component (e.g. capacitor) 180 can be arranged between two connection or contact leads, mentioned above with reference to FIG. 1, in the interior of the chip package 122 and conductively connect said contact leads to one another. A respective turn of the excitation coil 110 can be connected to both contact leads. That is to say that, outside the chip package 122, the contact leads could form or comprise the two excitation coil connections 131, 132. This would be advantageous for example if the chip package 122 comprises a leadframe. However, the same would also be conceivable in the case of chip packages 122 without a leadframe, such as, for example, in the case of wafer level ball grid array (WLB) packages or in the case of embedded wafer level ball grid array (eWLB) packages. This is because for this form of chip packages 122 redistribution planes are present in the interior of the chip package 122 and can connect the connections of the component (e.g. capacitor) 180 to those of the output driver of the excitation coil 110.

In the case, too, of the integration of the component 180 into the interior of the chip package 122 as proposed here, it is conceivable either for both the excitation coil connections 131, 132 to be arranged on the first or the second lateral outer side 141, 142 of the chip package 122, or for one respective excitation coil connection 131 to be arranged on the first lateral outer side 141 and the other respective excitation coil connection 132 to be arranged on the second lateral outer side 142 of the chip package 122. In any case the component 180 can conductively connect the two excitation coil connections 131, 132 to one another in the interior of the chip package 122.

Many types of available chip packages for semiconductor circuits comprise a leadframe having solid die paddles, to which the chip is fastened and which additionally form the connections, pins, wires or gullwings. The die paddles, in particular, which are usually configured in the form of a large-area sheet metal part, result in interference with the turns 110A-110D of the excitation coil 110, particularly if the turns 110A-110D run through under the chip package 122 in accordance with the concept described herein. This is because in this case the alternating magnetic field of the excitation coil 110 induces undesired eddy currents in the electrically conductive sheet metal parts (die paddles, leadframes, etc.) and the secondary magnetic field generated by these sheet metal parts in turn induces undesired signals in the pickup coils 120A, 120B, 120C.

In order to avoid this effect, it is proposed that the chip package 122 is embodied as a leadframeless package. The chip package 122 can be configured for example as a chip size package (CSP), or as a leadless chip carrier (LCC) package, or as a wafer level ball grid array (WLB) package, or as an embedded wafer level ball grid array (eWLB) package.

Figure 6:
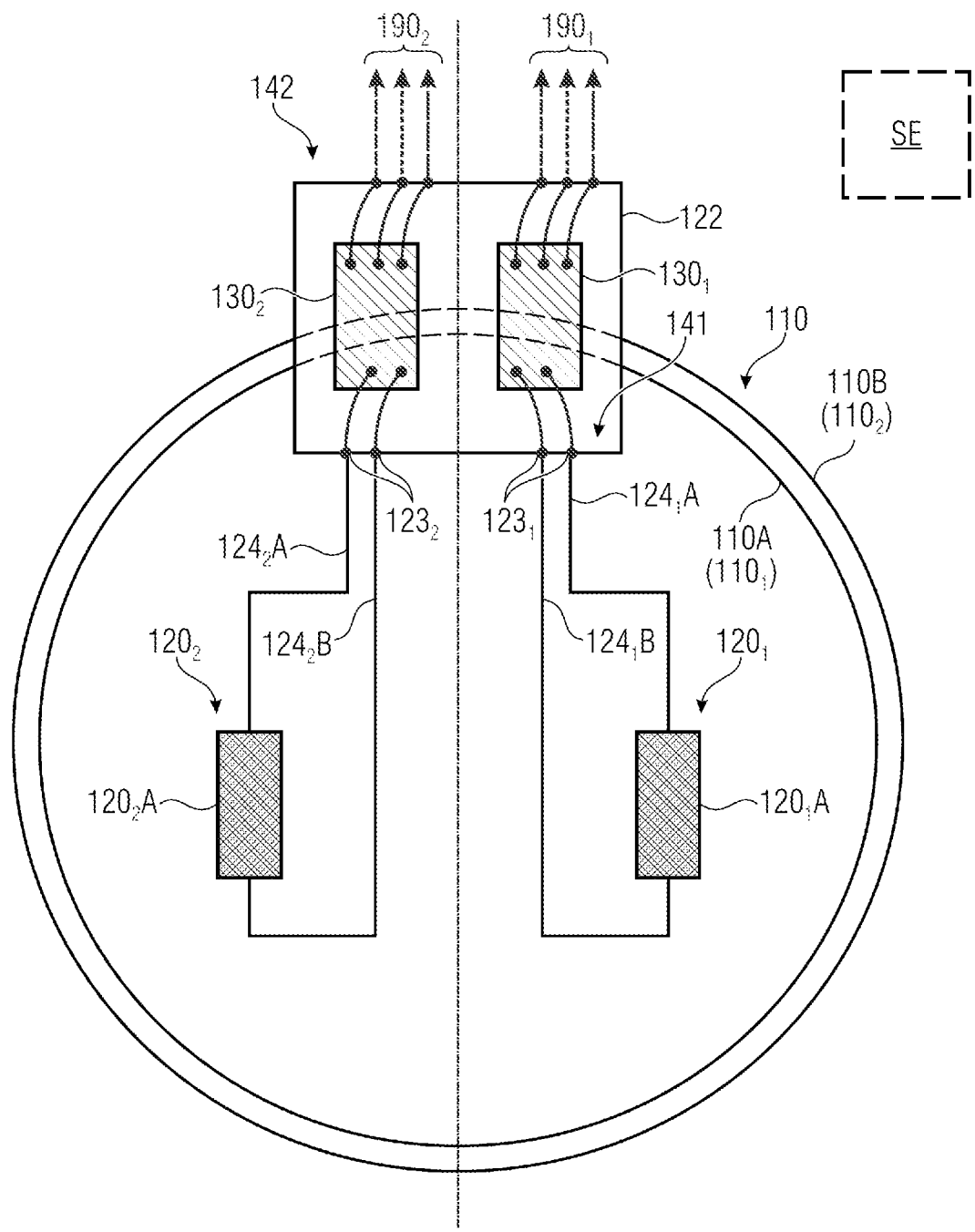
FIG. 6 shows a schematic plan view of a device in accordance with a further exemplary embodiment.

FIG. 6 shows a further exemplary embodiment of a device 100. One difference with respect to the exemplary embodiments discussed above resides inter alia in the fact that here two electronic chips $130_1$, $130_2$ each having a circuit for operating the device 100 are provided. The two chips $130_1$, $130_2$ can each be arranged in an individual chip package 122 described herein. Alternatively, the two chips $130_1$, $130_2$, as is depicted by way of example in FIG. 6, can be arranged jointly in one and the same chip package 122.

The device 100 can furthermore comprise a single excitation coil 110 having one or more turns 110A, 110B. Alternatively, the device 100 can comprise two ring-shaped (and optionally concentrically arranged) excitation coils $110_1$, $110_2$ each having one or more turns, wherein a first excitation coil $110_1$ can be connected to the first chip $130_1$ and a second excitation coil $110_2$ can be connected to the second chip $130_2$. The excitation coil connections 131, 132 discussed above are not illustrated here, purely for the sake of clarity.

The exemplary embodiment depicted in FIG. 6 provides a device 100 having two redundant system components. The vertical dash-dotted line denotes the boundary between the two redundant system components. In a plan view of the substrate plane SE, the two chips $130_1$, $130_2$ can be arranged over the one or more turns 110A, 110B of the excitation coil 110 or of the excitation coils $110_1$, $110_2$, such that precisely the latter run below the two chips $130_1$, $130_2$, which is illustrated by dashed lines in FIG. 6. The two chips $130_1$, $130_2$ can be arranged in a centered manner over the excitation coil 110 or over at least one of the excitation coils $110_1$, $110_2$, i.e. an imaginary straight connecting line between the centers of the two chips $130_1$, $130_2$ can run tangentially with respect to the excitation coil 110 or $110_1$ and/or $110_2$ running underneath.

Furthermore, the device 100 can comprise two pickup coil arrangements $120_1$, $120_2$. Here, too, in a plan view of the substrate plane SE, the two pickup coil arrangements $120_1$, $120_2$ can be arranged within the ring-shaped excitation coil 110 or within the two ring-shaped excitation coils $110_1$, $110_2$. A respective one of the two chips $130_1$, $130_2$ can be connected to a respective pickup coil arrangement $120_1$, $120_2$, wherein both pickup coil arrangements $120_1$, $120_2$ can each comprise one or more pickup coils $120_1A$, $120_2A$ etc. Accordingly, the chip package 122 can comprise one or more first electrical connections $123_1$ for connecting the individual pickup coils $120_1A$ etc. of the first pickup coil arrangement $120_1$. Furthermore, the chip package 122 can also comprise one or more second electrical connections $123_2$ for connecting the individual pickup coils $120_2A$ etc. of the second pickup coil arrangement $120_2$.

The pickup coils $120_1A$ etc. of the first pickup coil arrangement $120_1$ can be connected to the corresponding electrical connections $123_1$ of the chip package 122 by means of one or more first signal-carrying conductors $124_1A$, $124_1B$. The pickup coils $120_2A$ etc. of the second pickup coil arrangement $120_2$ can be connected to the corresponding electrical connections $123_2$ of the chip package 122 by means of one or more second signal-carrying conductors $124_2A$, $124_2B$.

In the embodiment shown here, too, the chip package 122 can be positioned on the substrate 101 in such a way that the one or more first and second signal-carrying conductors $124_1A$, $124_1B$, $124_2A$, $124_2B$ and the one or more turns 110A, 110B of the excitation coil 110 do not overlap in a plan view of the substrate plane 101.

The electrical connections $123_1$, $123_2$ for connecting the pickup coil arrangements $120_1$, $120_2$ can be arranged on the first lateral outer side 141 of the chip package 122 comprising contact connections. Alternatively, or additionally, the excitation coil connections 131, 132 (not explicitly illustrated here) can also be arranged on the first lateral outer side 141 of the chip package 122. Said first lateral outer side 141, as is depicted in FIG. 6, can be arranged within the ring-shaped excitation coil 110 or within both excitation coils $110_1$, $110_2$, or face at least the inner region (e.g. the center) of the excitation coil 110 or of the excitation coils $110_1$, $110_2$ (cf. e.g. FIG. 4).

The chip package 122 can additionally comprise electrical connections $190_1$, $190_2$ for power supply and/or in the form of input signal and/or output signal connections (I/O ports). Said electrical connections $190_1$, $190_2$ can be arranged on the opposite second lateral outer side 142 of the chip package 122 comprising contact connections. Said second lateral outer side 142, as is depicted in FIG. 6, can be arranged outside the ring-shaped excitation coil 110 or outside both excitation coils $110_1$, $110_2$ or face away from the inner region (e.g. the center) of the excitation coil 110 or of the excitation coils $110_1$, $110_2$.

In all embodiments described herein, therefore, the chip package 122 can be used to realize overlap-free routing of the conductor track traces 124 of the one or more pickup coil arrangements $120_1$, $120_2$ relative to the one or more turns 110A, . . . , 110D of the excitation coil 110. In some exemplary embodiments, the electrical connections 123 for the pickup coil arrangements $120_1$, $120_2$ can be arranged on a lateral outer side 141 of the chip package 122 which, in a plan view of the substrate plane SE, faces the inner region (e.g. center) of the excitation coil 110, or is arranged within the excitation coil 110. This can preferably concern all electrical connections 123 present for connecting all pickup coil arrangements $120_1$, $120_2$ present. Other electrical connections, for example power supply connections 161, 162 and/or I/O ports $163_1$, . . . , $163_n$, can be provided on an opposite lateral outer side 142 of the chip package 122, wherein this outer side 142, in a plan view of the substrate plane SE, faces away from the inner region (e.g. center) of the excitation coil 110, or is arranged outside the excitation coil 110. This can preferably concern all electrical connections 161, 162, $163_1$, . . . , $163_n$ present with the exception of the electrical connections 123 for connecting all pickup coil arrangements $120_1$, $120_2$ present. All excitation coil connections 131, 132 present can be arranged in each case jointly on a respective one of the two lateral outer sides 141, 142 of the chip package 122. Alternatively, a first excitation coil connection 131 can be arranged on the first lateral outer side 141, and a second excitation coil connection 132 can be arranged on the second lateral outer side 142.

Some exemplary embodiments of the concept described herein relate to the described chip package 122 for a device 100, for example for a stator component or a rotor component of an inductive angle sensor. The chip package 122 described herein can comprise in particular a chip 130 with an integrated semiconductor circuit (IC: integrated circuit) for operating the device 100. The device 100 itself can be in particular a stator component or a rotor component of an inductive angle sensor.

The chip 130 can comprise for example an integrated circuit configured to feed the excitation coil 110 of the inductive angle sensor with an input signal, for example with an alternating current signal. The chip 130 can furthermore comprise an integrated circuit configured to receive and/or to evaluate an output signal, for example an alternating current signal induced in the pickup coil arrangement 120 of the inductive angle sensor.

The chip package 122 can comprise electrical connections for various purposes. By way of example, the chip package 122 can comprise electrical connections 161, 162 for power supply, and/or one or more signal input and/or signal output connections $163_1$, . . . , $163_n$, and/or electrical connections 131, 132 for contacting the excitation coil 110, and/or one or more electrical connections 151, 152, 153 for contacting the individual pickup coils 120A, 120B, 120C of the pickup coil arrangement 120.

The electrical connections 131, 132 for contacting the excitation coil 110, and/or the one or more electrical connections 151, 152, 153 for contacting the individual pickup coils 120A, 120B, 120C of the pickup coil arrangement 120 can be arranged on a first lateral outer side 141 of the chip package 122. The electrical connections 161, 162 for power supply and/or the one or more signal input and/or signal output connections $163_1$, . . . , $163_n$ can be arranged on a second lateral outer side 142 of the chip package 122 situated opposite the first lateral outer side 141.

By way of example, all electrical connections 131, 132 present for contacting the excitation coil 110, and/or all electrical connections 151, 152, 153 present for contacting the individual pickup coils 120A, 120B, 120C of the pickup coil arrangement 120 can be arranged on the first lateral outer side 141 of the chip package 122. Alternatively, or additionally, all electrical connections 161, 162 present for power supply and/or all signal input and/or signal output connections $163_1$, . . . , $163_n$ present can be arranged on the second lateral outer side 142 of the chip package 122.

The first lateral outer side 141 can be arranged within the excitation coil 110, in a plan view of the substrate plane SE. Alternatively, the first lateral outer side 141 can face at least the inner region of the (e.g. ring-shaped) excitation coil 110, in a plan view of the substrate plane SE. In a further conceivable alternative, the first lateral outer side 141 can face at least the excitation coil 110, in a plan view of the substrate plane SE.

The second lateral outer side 142 can be arranged outside the excitation coil 110, in a plan view of the substrate plane SE. Alternatively, the second lateral outer side 142 can face away from at least the inner region of the (e.g. ring-shaped) excitation coil 110, in a plan view of the substrate plane SE.

In some conceivable exemplary embodiments, the chip package 122 can be embodied in such a way that it has no solid die paddles. Furthermore, the chip package 122 can be embodied as leadframeless, i.e. can have no metallic leadframe. It is also conceivable for the chip package 122 to be embodied as contact leadless, i.e. it has no lateral contact leads. The chip package 122 can have contact lands instead. By way of example, the chip package 122 can be configured as a WLB or eWLB package. As depicted for illustrative purposes in the figures discussed, the chip package 122 can be arranged on the first main side 101A of the substrate 101. This could be that main side of the substrate 101 which faces the rotor component in the case of an assembled inductive angle sensor. Alternatively, however, the chip package 122 can also be arranged on the opposite second main side 101B of the substrate 101, i.e. that main side of the substrate 101 which faces away from the rotor component in the case of an assembled angle sensor.

Some exemplary embodiments relate to a complete inductive angle sensor system, or an inductive angle sensor. The inductive angle sensor can comprise a stator component with at least one excitation coil 110 and one or more pickup coil arrangements $120_1$, $120_2$. The stator component can be the device 100 described herein, for example. The stator component can furthermore comprise the chip package 122 described herein with a sensor chip 130 packaged therein.

The inductive angle sensor can furthermore comprise a rotor component that is movable (in particular rotatable) relative to the stator component. The rotor component can comprise an inductive target.

The chip package 122 can be arranged or positioned on the stator component in such a way that it covers one or more turns 110A 110D of the excitation coil 110, in a plan view of the substrate plane SE. That is to say that the chip package 122 can be arranged directly over said one or more turns 110A 110D of the excitation coil 110 on the substrate 101.

The chip package 122 can indeed, as mentioned, be arranged over the one or more turns 110A 110D of the excitation coil 110, but with the exception of those conductor track traces which lead to the excitation coil connections 131, 132. These conductor track traces can run outside the contour of the chip package 122, in a plan view of the substrate plane SE. Alternatively or additionally, in each case the innermost and/or outermost turn of the excitation coil 110 can also run outside the contour of the chip package 122.

The exemplary embodiments described above merely constitute an illustration of the principles of the innovative concept described herein. It goes without saying that modifications and variations of the arrangements and details described herein will be apparent to others skilled in the art. Therefore, the intention is for the concept described herein to be restricted only by the scope of protection of the following patent claims, and not by the specific details which have been presented herein on the basis of the description and the explanation of the exemplary embodiments.

What is claimed is:

1. A device, comprising:
a substrate with an excitation coil configured to generate a first magnetic field in reaction to an input signal fed in, and with a pickup coil arrangement configured to generate an output signal in reaction to a second magnetic field,
wherein the substrate extends in a substrate plane,
wherein the pickup coil arrangement comprises at least one pickup coil configured in one or more metallization layers of the substrate,
wherein the excitation coil comprises one or more turns arranged around the pickup coil arrangement in a ring-shaped manner in a plan view of the substrate plane; and
an electronic chip comprising a circuit configured to feed the excitation coil with the input signal and to detect the output signal of the pickup coil arrangement,
wherein the electronic chip is arranged in a chip package which comprises at least one electrical connection connected to the at least one pickup coil of the pickup coil arrangement by a signal-carrying conductor, and
wherein the chip package is positioned on the substrate in such a way that the signal-carrying conductor and the one or more turns of the excitation coil do not overlap in a plan view of the substrate plane.

2. The device as claimed in claim 1,
wherein the chip package is arranged on the substrate in such a way that it extends over at least one of the one or more turns of the excitation coil, in a plan view of the substrate plane, and the at least one turn of the one or more turns the excitation coil thus runs through under the chip package.

3. The device as claimed in claim 1,
wherein the one or more turns of the excitation coil comprises 1 to n turns and wherein at least a second to nth turns of the 1 to n turns run through under the chip package.

4. The device as claimed in claim 1,
wherein the at least one electrical connection connected to the at least one pickup coil of the pickup coil arrangement is arranged within the excitation coil, in a plan view of the substrate plane.

5. The device as claimed in claim 1,
wherein the chip package comprises further electrical connections connected to further pickup coils of the pickup coil arrangement, and
wherein the further electrical connections are arranged within the excitation coil, in a plan view of the substrate plane.

6. The device as claimed in claim 1,
wherein a first lateral outer side of the chip package is arranged within the excitation coil, in a plan view of the substrate plane, and
wherein a second lateral outer side of the chip package arranged opposite to the first lateral outer side is arranged outside the excitation coil, in a plan view of the substrate plane.

7. The device as claimed in claim 6,
wherein the chip package further comprises two electrical excitation coil connections connected to the excitation coil,
wherein the two electrical excitation coil connections are arranged on the first lateral outer side of the chip package arranged within the excitation coil.

8. The device as claimed in claim 7,
wherein the device further comprises an electrical capacitor element connected in parallel with the two electrical excitation coil connections, and
wherein the electrical capacitor element is arranged within the excitation coil, in a plan view of the substrate plane.

9. The device as claimed in claim 6,
wherein the chip package further comprises two electrical excitation coil connections connected to the excitation coil,
wherein the two electrical excitation coil connections are arranged on the second lateral outer side of the chip package arranged outside the excitation coil.

10. The device as claimed in claim 9,
wherein the device further comprises an electrical resistor element connected in parallel with the two electrical excitation coil connections, and
wherein the electrical resistor element is arranged outside the excitation coil, in a plan view of the substrate plane.

11. The device as claimed in claim 6,
wherein the chip package further comprises two electrical excitation coil connections connected to the excitation coil,
wherein a first excitation coil connection of the two electrical excitation coil connections is arranged on the first lateral outer side of the chip package arranged within the excitation coil, and
wherein a second excitation coil connection of the two electrical excitation coil connections is arranged on the second lateral outer side of the chip package arranged outside the excitation coil.

12. The device as claimed in claim 6,
wherein the chip package further comprises a power supply connection and also at least one of a signal input connection or a signal output connection,
wherein the power supply connection and the signal input connection or the power supply connection and the signal output connection are arranged on the second lateral outer side of the chip package arranged outside the excitation coil.

13. The device as claimed in claim 1,
wherein the device comprises a second pickup coil arrangement,
wherein the one or more turns of the excitation coil are arranged around the second pickup coil arrangement in a ring-shaped manner, in a plan view of the substrate plane, and
wherein the device comprises a second electronic chip for operating the second pickup coil arrangement,
wherein the second electronic chip is arranged in the chip package,
wherein the chip package comprises at least one second electrical connection connected to at least one pickup coil of the second pickup coil arrangement by a second signal-carrying conductor, and
wherein the chip package is positioned on the substrate in such a way that the second signal-carrying conductor and the one or more turns of the excitation coil do not overlap in a plan view of the substrate plane.

14. The device as claimed in claim 1,
wherein the chip package is embodied as a leadframeless package, a chip size package, a leadless chip carrier package, a wafer level ball grid array package, or an embedded wafer level ball grid array package.

15. A chip package for a device,
wherein the device comprises
   a substrate with an excitation coil configured to generate a first magnetic field in reaction to an input signal fed in, and with a pickup coil arrangement configured to generate an output signal in reaction to a second magnetic field,
      wherein the substrate extends in a substrate plane,
      wherein the pickup coil arrangement comprises at least one pickup coil configured in one or more metallization layers of the substrate, and
      wherein the excitation coil comprises one or more turns arranged around the pickup coil arrangement in a ring-shaped manner in a plan view of the substrate plane; and
   an electronic chip comprising a circuit configured to feed the excitation coil with the input signal and to detect the output signal of the pickup coil arrangement,
the chip package comprising:
   a housing that houses the electronic chip; and
   at least one electrical connection connected to the at least one pickup coil of the pickup coil arrangement by a signal-carrying conductor,
      wherein the chip package is positioned on the substrate in such a way that the signal-carrying conductor and the one or more turns of the excitation coil do not overlap in a plan view of the substrate plane.

16. An inductive angle sensor, comprising:
a device comprising:
   a substrate with an excitation coil configured to generate a first magnetic field in reaction to an input signal fed in, and with a pickup coil arrangement configured to generate an output signal in reaction to a second magnetic field,
      wherein the substrate extends in a substrate plane,
      wherein the pickup coil arrangement comprises at least one pickup coil configured in one or more metallization layers of the substrate, and
      wherein the excitation coil comprises one or more turns arranged around the pickup coil arrangement in a ring-shaped manner in a plan view of the substrate plane; and
   an electronic chip comprising a circuit configured to feed the excitation coil with the input signal and to detect the output signal of the pickup coil arrangement,
      wherein the electronic chip is arranged in a chip package which comprises at least one electrical connection connected to the at least one pickup coil of the pickup coil arrangement by a signal-carrying conductor, and
      wherein the chip package is positioned on the substrate in such a way that the signal-carrying conductor and the one or more turns of the excitation coil do not overlap in a plan view of the substrate plane.

* * * * *